US012791643B2

(12) United States Patent
Gallivan et al.

(10) Patent No.: US 12,791,643 B2
(45) Date of Patent: Nov. 10, 2026

(54) CONNECTIVITY-BASED MULTI-MODAL NORMATIVE MODEL

(71) Applicant: PANAXIUM RESEARCH INC., Etobicoke (CA)

(72) Inventors: Jason P. Gallivan, Kingston (CA); Christopher I. Murray, Kingston (CA); Douglas James Cook, Toronto (CA)

(73) Assignee: PANAXIUM RESEARCH INC., Etobicoke (CA)

( * ) Notice: Subject to any disclaimer, the term of this patent is extended or adjusted under 35 U.S.C. 154(b) by 0 days.

(21) Appl. No.: 19/103,627

(22) PCT Filed: Aug. 14, 2023

(86) PCT No.: PCT/IB2023/000483

§ 371 (c)(1),
(2) Date: Feb. 13, 2025

(87) PCT Pub. No.: WO2024/038317

PCT Pub. Date: Feb. 22, 2024

(65) Prior Publication Data

US 2026/0056272 A1 Feb. 26, 2026

Related U.S. Application Data

(60) Provisional application No. 63/397,974, filed on Aug. 15, 2022.

(51) Int. Cl.
*G01R 33/48* (2006.01)
*G01R 33/563* (2006.01)

(52) U.S. Cl.
CPC ... *G01R 33/4806* (2013.01); *G01R 33/56341* (2013.01)

(58) Field of Classification Search
None
See application file for complete search history.

(56) References Cited

U.S. PATENT DOCUMENTS

2020/0167694 A1 5/2020 Pisner

FOREIGN PATENT DOCUMENTS

| | | |
|---|---|---|
| CN | 102908145 A | 2/2013 |
| CN | 107658018 A | 2/2018 |
| CN | 114708263 A | 7/2022 |

OTHER PUBLICATIONS

"Machine Learning on Human Connectome Data from MRI" by C.J. Brown et al. arXiv, 1611.08699. 2016.*

(Continued)

*Primary Examiner* — Jason M Ip
(74) *Attorney, Agent, or Firm* — Pierce Atwood LLP

(57) ABSTRACT

Methods and systems for generating and using a multi-modal normative model of a brain are described. The method for generating the multi-modal normative model comprises receiving functional magnetic resonance imaging (fMRI) data and diffusion MRI (dMRI) data for each of a plurality of human subjects, generating, based on the fMRI data, functional connectivity data for each of the plurality of human subjects, generating, based on the dMRI data, structural connectivity data for each of the plurality of human subjects, determining, based on the structural connectivity data and/or the functional connectivity data, at least one brain network connectivity measure associated with each of a plurality of brain regions, and generating a multi-modal normative model that includes the at least one brain network connectivity measure associated with each of the plurality of brain regions.

20 Claims, 14 Drawing Sheets

(56) References Cited

OTHER PUBLICATIONS

Bassett, D. S., et al., "Network neuroscience." Nature neuroscience 20.3 (2017): 353-364.
Bullmore, E. et al., "Complex brain networks: graph theoretical analysis of structural and functional systems." Nature reviews neuroscience 10.3 (2009): 186-198.
Hong, S.-J., et al. "Toward a connectivity gradient-based framework for reproducible biomarker discovery." Neurolmage 223 (2020): 117322.
International Search Report and Written Opinion from the International Searching Authority mailed Jan. 9, 2024 for International Application No. PCT/IB2023/000483.
Margulies, D. S., et al. "Situating the default-mode network along a principal gradient of macroscale cortical organization." Proceedings of the National Academy of Sciences 113.44 (2016): 12574-12579.
Nenning, K.-H., et al. "Joint embedding: A scalable alignment to compare individuals in a connectivity space." Neuroimage 222 (2020): 117232.
Potvin, O., et al. "NOMIS: Quantifying morphometric deviations from normality over the lifetime of the adult human brain." BioRxiv (2021): Jan. 2021.
Potvin, O., et al. "Normative data for subcortical regional volumes over the lifetime of the adult human brain." Neuroimage 137 (2016): Sep. 2020.
Potvin, O., et al. "Normative morphometric data for cerebral cortical areas over the lifetime of the adult human brain." Neuroimage 156 (2017): 315-339.).
Vos De Wael, R., et al. "BrainSpace: a toolbox for the analysis of macroscale gradients in neuroimaging and connectomics datasets." Communications biology 3.1 (2020): 103.
Bajada Claude J. et al: "A tutorial and 9-13 tool for exploring feature similarity gradients with MRI data", Neuroimage, [Online] vol. 221, No. 117140, Nov. 1, 2020 (Nov. 1, 2020), pp. 1-11, XP093352730, Amsterdam, NL ISSN: 1053-8119, DOI: 10.1016/j.neuroimage.2020.117140 Retrieved from the Internet: URL:https://www.sciencedirect.com/science/article/pii/S1053811920306261/pdfft?md5=3a A61B3574140742dab4595b72d08526db36&pid=1-s2.0-G01RS1053811920306261-main.pdf> G06T.
Extended European Search Report of the European Patent Office mailed Jan. 28, 2026 for European Patent Application No. 23854583.4, 15 pages.

* cited by examiner

CONNECTIVITY-BASED MULTI-MODAL NORMATIVE MODEL

FIELD OF THE INVENTION

This disclosure relates to generating and use of a connectivity-based multi-model normative model for brain imaging.

BACKGROUND

Normative models used in neuroimaging applications can be applied to individual subjects (e.g., patient populations) to compute Z scores that quantify that subject's deviation from the normative range. Recently, normative models have been developed that deal primarily with measures of brain cortical architecture (e.g., cortical surface area, cortical thickness and gray matter volume) for different brain regions. In this sense, these normative models can be 'multidimensional', in that they can include multiple measures per brain region to define normative ranges.

SUMMARY

In some embodiments, a method of generating a multi-modal normative model of a brain is provided. The method comprises receiving functional magnetic resonance imaging (fMRI) data and diffusion MRI (dMRI) data for each of a plurality of human subjects, generating, based on the fMRI data, functional connectivity data for each of the plurality of human subjects, generating, based on the dMRI data, structural connectivity data for each of the plurality of human subjects, determining, based on the structural connectivity data and/or the functional connectivity data, at least one brain network connectivity measure associated with each of a plurality of brain regions, and generating a multi-modal normative model that includes the at least one brain network connectivity measure associated with each of the plurality of brain regions.

In one aspect, generating functional connectivity data comprises extracting, within each of the plurality of brain regions, fMRI time series data, and computing, based on the extracted fMRI time series data, correlation coefficients between pairwise sets of regions of the plurality of regions, wherein the functional connectivity data includes the correlation coefficients for each region of the plurality of regions. In one aspect, the correlation coefficients are Pearson correlation coefficients. In one aspect, generating structural connectivity data comprises determining, based on the dMRI data, a number of fiber tracts connecting pairwise sets of regions of the plurality of regions, wherein the structural connectivity data includes the number of fiber tracts for each region of the plurality of regions.

In one aspect, determining at least one brain network connectivity measure comprises performing graph theoretic analysis on the structural connectivity data and/or the functional connectivity data to define a plurality of brain network connectivity measures associated with each of the plurality of brain regions. In one aspect, the method further comprises thresholding the functional connectivity data to generate thresholded functional connectivity data, and binarizing the thresholded functional connectivity data to generate binarized functional connectivity data, wherein performing graph theoretic analysis on the functional connectivity data comprises performing graph theoretic analysis on the binarized functional connectivity data. In one aspect, the method further comprises thresholding the structural connectivity data to generate thresholded structural connectivity data, and binarizing the thresholded structural connectivity data to generate binarized structural connectivity data, wherein performing graph theoretic analysis on the structural connectivity data comprises performing graph theoretic analysis on the binarized structural connectivity data. In one aspect, performing graph theoretic analysis comprises computing at least one local topographical property of the structural connectivity data and/or the functional connectivity data. In one aspect, the plurality of brain network connectivity measures include one or more of degree, centrality and clustering coefficient. In one aspect, generating a multi-modal normative model comprises normalizing the at least one brain network connectivity measure across the plurality of human subjects, and generating the multi-modal normative model based on the normalized at least one brain connectivity measure.

In one aspect, determining at least one brain network connectivity measure comprises constructing, based on the structural connectivity data and/or the functional connectivity data, an affinity matrix for each subject of the plurality of human subjects, generating a set of gradients for each subject based, at least in part, on the affinity matrix, aligning the set of gradients for each subject to a group averaged template, and determining, for each subject and for each of the plurality of brain regions, a projection of each brain region onto each gradient, thereby determining the at least one brain network connectivity measure for each region of the plurality of regions. In one aspect, the method further comprises thresholding the functional connectivity data to generate thresholded functional connectivity data, wherein the constructing an affinity matrix based on the functional connectivity data comprises constructing the affinity matrix based on the thresholded functional connectivity data. In one aspect, the method further comprises thresholding the structural connectivity data to generate thresholded structural connectivity data, wherein the constructing an affinity matrix based on the structural connectivity data comprises constructing the affinity matrix based on the thresholded structural connectivity data. In one aspect, constructing the affinity matrix comprises using cosine similarity to construct the affinity matrix. In one aspect, generating a set of gradients for each subject based, at least in part, on the affinity matrix comprises reducing a dimensionality of the affinity matrix to derive a low dimensional manifold representation of the affinity matrix, wherein the set of gradients is generated based on the low dimensional manifold representation. In one aspect, reducing a dimensionality of the affinity matrix comprises applying Principal Component Analysis or Diffusion Map Embedding to the affinity matrix. In one aspect, the at least one brain network connectivity measure includes a value representing a component loading onto each gradient in the set of gradients. In one aspect, the method further comprises defining the plurality of brain regions based on a brain atlas. In one aspect, the fMRI data is resting-state fMRI data.

In some embodiments, a method of using a multi-modal normative model to identify one or more abnormal brain regions in a patient is provided. The method comprises receiving functional magnetic resonance imaging (fMRI) data and diffusion MRI (dMRI) data for the patient, generating, based on the fMRI data, functional connectivity data for the patient, generating, based on the dMRI data, structural connectivity data for the patient, determining, based on the structural connectivity data and/or the functional connectivity data, at least one brain network connectivity measure associated with each of a plurality of brain regions, and identifying one or more abnormal brain regions of the patient based, at least in part on a comparison of the determined at least one brain network connectivity measure for the patient and a multi-modal normative model generated based, at least in part, on structural connectivity data and/or functional connectivity data determined for a plurality of human subjects.

In one aspect, generating functional connectivity data comprises extracting, within each of the plurality of brain regions, fMRI time series data, and computing, based on the extracted fMRI time series data, correlation coefficients between pairwise sets of regions of the plurality of regions, wherein the functional connectivity data includes the correlation coefficients for each region of the plurality of regions. In one aspect, the correlation coefficients are Pearson correlation coefficients. In one aspect, generating structural connectivity data comprises determining, based on the dMRI data, a number of fiber tracts connecting pairwise sets of regions of the plurality of regions, wherein the structural connectivity data includes the number of fiber tracts for each region of the plurality of regions.

In one aspect, determining at least one brain network connectivity measure comprises performing graph theoretic analysis on the structural connectivity data and/or the functional connectivity data to define a plurality of brain network connectivity measures associated with each of the plurality of brain regions. In one aspect, the method further comprises thresholding the functional connectivity data to generate thresholded functional connectivity data, and binarizing the thresholded functional connectivity data to generate binarized functional connectivity data, wherein performing graph theoretic analysis on the functional connectivity data comprises performing graph theoretic analysis on the binarized functional connectivity data. In one aspect, the method further comprises thresholding the structural connectivity data to generate thresholded structural connectivity data, and binarizing the thresholded structural connectivity data to generate binarized structural connectivity data, wherein performing graph theoretic analysis on the structural connectivity data comprises performing graph theoretic analysis on the binarized structural connectivity data. In one aspect, performing graph theoretic analysis comprises computing at least one local topographical property of the structural connectivity data and/or the functional connectivity data. In one aspect, the plurality of brain network connectivity measures include one or more of degree, centrality and clustering coefficient. In one aspect, the multi-modal normative model is generated based on at least one normalized brain connectivity measure.

In one aspect, determining at least one brain network connectivity measure comprises constructing, based on the structural connectivity data and/or the functional connectivity data, an affinity matrix for each subject of the plurality of human subjects, generating a set of gradients for each subject based, at least in part, on the affinity matrix, aligning the set of gradients for each subject to a group averaged template, and determining, for each subject and for each of the plurality of brain regions, a projection of each brain region onto each gradient, thereby determining the at least one brain network connectivity measure for each region of the plurality of regions. In one aspect, the method further comprises thresholding the functional connectivity data to generate thresholded functional connectivity data, wherein the constructing an affinity matrix based on the functional connectivity data comprises constructing the affinity matrix based on the thresholded functional connectivity data. In one aspect, the method further comprises thresholding the structural connectivity data to generate thresholded structural connectivity data, wherein the constructing an affinity matrix based on the structural connectivity data comprises constructing the affinity matrix based on the thresholded structural connectivity data. In one aspect, constructing the affinity matrix comprises using cosine similarity to construct the affinity matrix. In one aspect, generating a set of gradients for each subject based, at least in part, on the affinity matrix comprises reducing a dimensionality of the affinity matrix to derive a low dimensional manifold representation of the affinity matrix, wherein the set of gradients is generated based on the low dimensional manifold representation. In one aspect, reducing a dimensionality of the affinity matrix comprises applying Principal Component Analysis or Diffusion Map Embedding to the affinity matrix. In one aspect, the at least one brain network connectivity measure includes a value representing a component loading onto each gradient in the set of gradients. In one aspect, the method further comprises defining the plurality of brain regions based on a brain atlas. In one aspect, the fMRI data is resting-state fMRI data.

In some embodiments, a method of treating a patient having a brain disorder is provided. The method comprises determining, based on the structural connectivity data and/or the functional connectivity data associated with the patient, at least one brain network connectivity measure associated with each of a plurality of brain regions, identifying one or more abnormal brain regions of the patient based, at least in part on a comparison of the determined at least one brain network connectivity measure for the patient and a multi-modal normative model generated based, at least in part, on structural connectivity data and/or functional connectivity data determined for a plurality of human subjects, and providing treatment to the patient, wherein the treatment is targeted to remediate connectivity deficits within the one or more abnormal brain regions.

In some embodiments, a computing device is provided. The computing device comprises at least one computer processor, and at least one non-transitory computer-readable medium encoded with a plurality of instructions that, when executed by the at least one computer processor perform any of the methods described herein.

BRIEF DESCRIPTION OF DRAWINGS

Various non-limiting embodiments of the technology will be described with reference to the following figures. It should be appreciated that the figures are not necessarily drawn to scale.

DETAILED DESCRIPTION

Contemporary cognitive neuroscience suggests that sensory, cognitive and motor functions are not the result of computations being performed in distinct brain area, but rather computations performed across whole-brain distributed networks. Several disease states of the brain/mind also reflect disorders of brain network connections and/or dynamics rather than deficits in focused brain regions. As noted herein, some existing normative models used to detect deviations from a normal population of subjects include measures, such as cortical surface area, cortical thickness and brain volume within single brain regions.

The inventors have recognized and appreciated that some existing normative models used in neuroimaging applications may be improved by including network-based information that describes structural and/or functional connectivity between different brain regions. To this end, some embodiments of the present disclosure relate to techniques for generating and/or using a multi-modal normative model based on magnetic resonance imaging (MRI) data recorded from a plurality of human subjects. In such a model, the normative data for a brain region may reflect information about its structural connections (e.g., white matter tracts) and/or functional interactions with widely distributed brain areas, and may be useful for characterizing individual differences in connectivity relative to the normative model.

As described herein, some embodiments of the present disclosure incorporate information extracted from functional magnetic resonance imaging (fMRI) data (e.g., resting state fMRI data) and diffusion magnetic resonance imaging (dMRI) data (e.g., diffusion tensor imaging data) from a plurality of human subjects into a multi-modal normative model (e.g., a whole-brain normative model). Recently, graph theoretic analyses have been applied to resting-state fMRI and dMRI data, revealing many core facets of brain functional and structural organization that are not accounted for by single-region measures of brain architecture. An advantage of graph theoretic analyses is that they allow for complex high-dimensional data (e.g., connectomic data) to effectively be dimension-reduced into a series of single measures per brain region, while still capturing information about the connectivity of brain regions. For instance, graph theoretic measures per region can be used to characterize important details about those regions within the context of the whole-brain networks in which they are embedded (e.g., number of connections per region, the centrality, or importance, of each region in the network, etc.). The techniques described herein compress connectomic brain data into the same N-dimensional space as brain architecture measures (e.g., one measure per brain region).

Figure 1A:
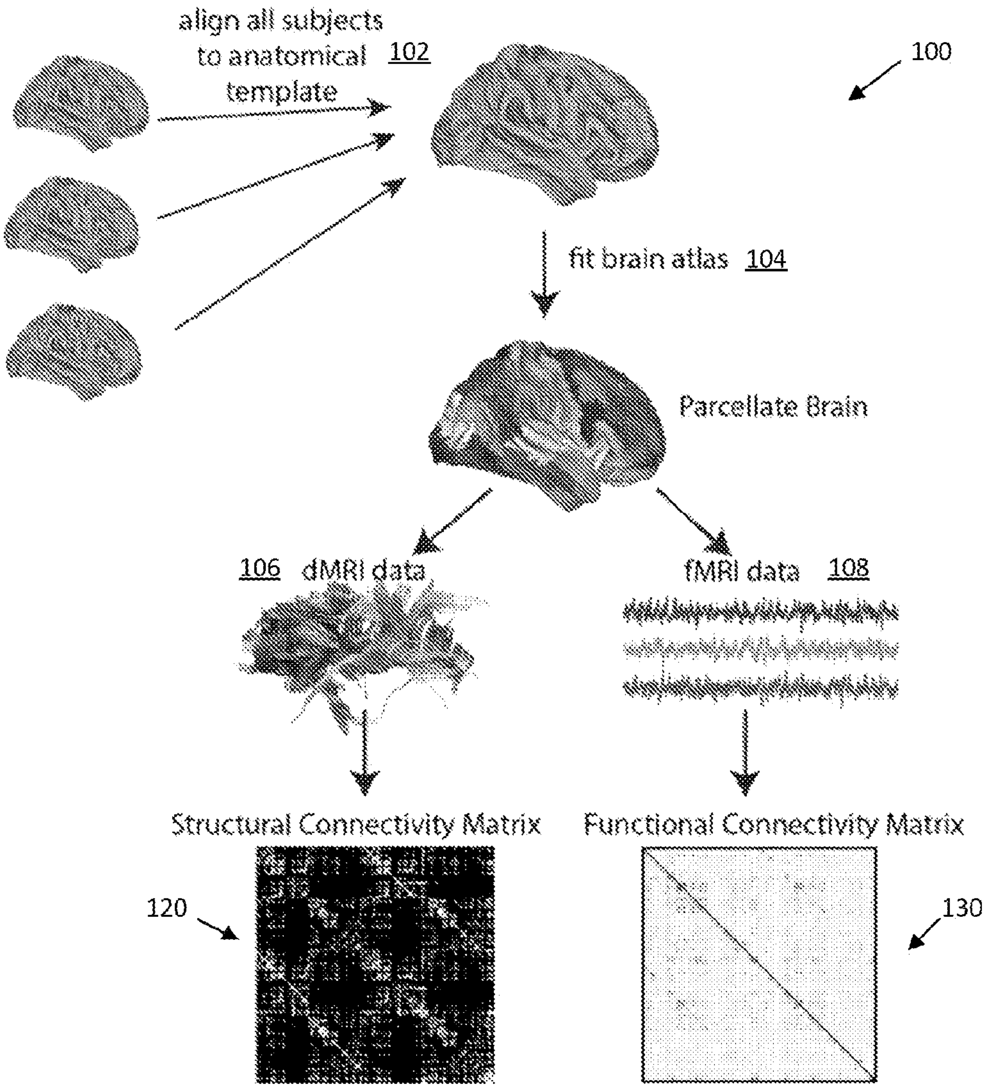
FIG. 1A schematically illustrates a process for generating structural connectivity data and functional connectivity data in accordance with some embodiments of the present disclosure.

FIG. 1A schematically illustrates a process 100 for generating functional connectivity data from resting state fMRI data and structural connectivity data from dMRI data, respectively. As described herein, the terms "connectivity matrix" or "connectivity matrices" are used to reflect that the functional connectivity data and the structural connectivity data inhabit a region×region dimensionality, whereby each row in the matrix depicts the 'connections' of a single region to other brain regions (columns). By contrast, some conventional computed measures (e.g., related to neuroanatomy) that do not take connectivity into account, may be implemented as 1×region vectors. Accordingly, as shown in FIG. 1, the output of process 100 is a structural connectivity matrix 120 and a functional connectivity matrix 130, with different brain regions being represented along the rows and columns of the matrices.

As shown in FIG. 1A, process 100 begins in act 102 by aligning structural magnetic resonance data (e.g., T1-weighted and/or T2-weighted MRI data) for each of a plurality of human subjects to an anatomical template. Any suitable anatomical template may be used. For instance, an anatomical template generated from an average of the subjects to be aligned may be used. Alternatively, a standardized template (e.g., a Montreal Neurological Institute (MNI) standard template, such as the ICBM152 template) may be used. Process 100 then proceeds to act 104, where a brain atlas is used to parcellate the brain space (e.g., cortex and subcortex) for each subject into a plurality of brain regions. It should be appreciated that any suitable structural or functional brain atlas may be used in act 104, examples of which include, but are not limited to the Harvard-Oxford atlas for structural parcellation and the Schaeffer atlas for functional parcellation.

Process 100 then proceeds to act 106, where automatic fiber tracking (e.g., tractography) is performed using the diffusion MRI data for each subject to identify structural connections between the different brain regions specified in the parcellated brain. In some implementations the degree of structural connectedness between regions is quantified by determining the number of fiber tracts present between each pairwise set of regions, resulting in structural connectivity matrix 120. In act 108, a time series of fMRI data (e.g., resting-state fMRI data) is extracted from each of the different brain regions specified in the parcellated brain. Each of the brain regions specified in parcellated brain may be associated with a plurality of voxels contained within that parcel. To determine the time series of fMRI data with a particular brain region, the time series of fMRI data may be calculated for each of the voxels in the corresponding parcel, and an average time series across all voxels located within the brain parcel may be used for functional connectivity analysis as described herein. In some implementations, the degree of functional connectedness between regions is quantified by computing the correlation coefficient (e.g., Pearson correlation coefficient) for each pairwise set of regions, resulting in function connectivity matrix 130.

Figure 1B:
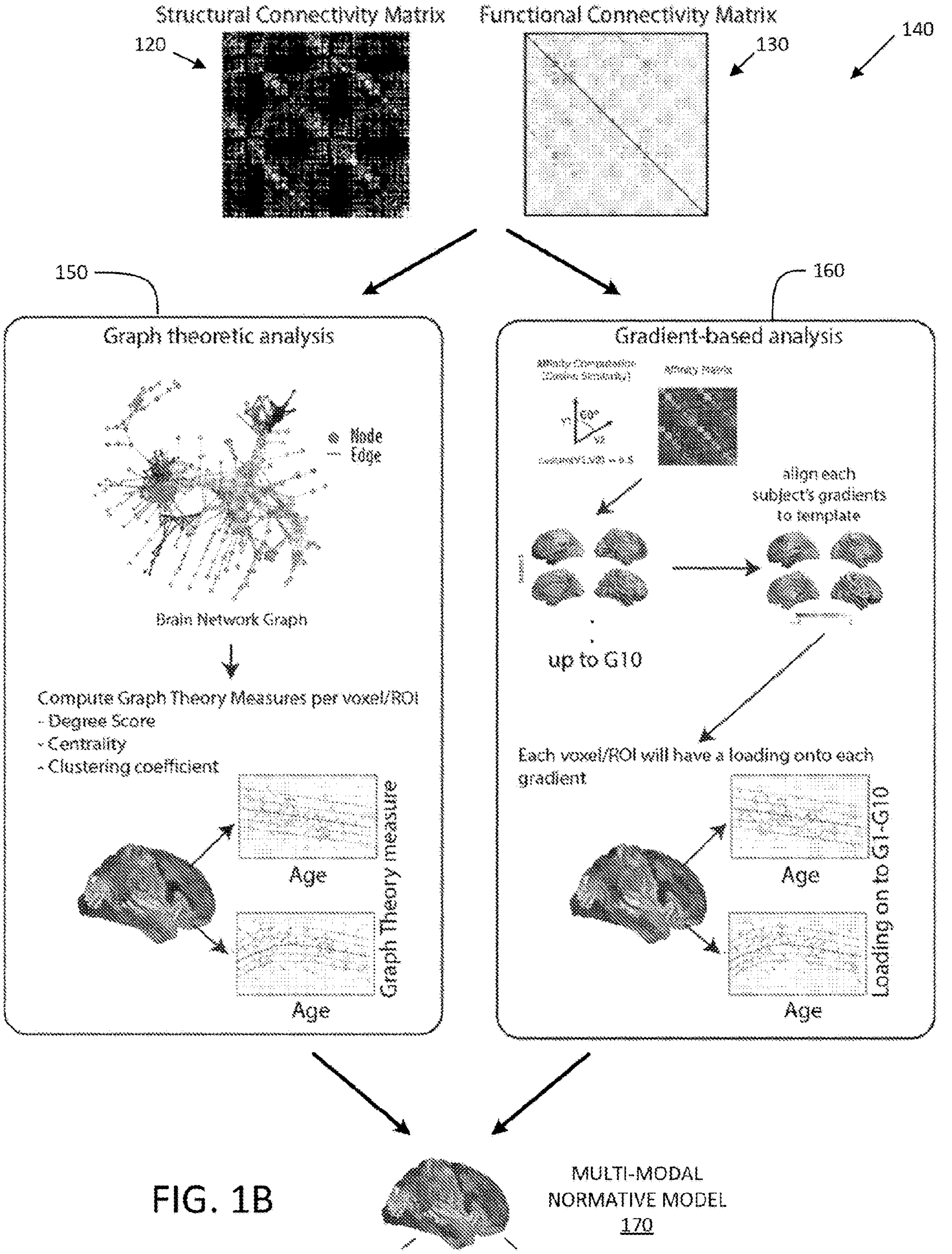
FIG. 1B schematically illustrates a process for generating a multi-modal normative model based on structural and functional connectivity data in accordance with some embodiments of the present disclosure.

In accordance with the techniques described herein, the structural connectivity matrix 120 and the functional connectivity matrix 130 are subjected to further analysis to generate a multi-modal normative model that includes connectivity information for a plurality of brain regions. FIG. 1B schematically illustrates a process 140 for generating at least one multi-modal normative model based on structural connectivity data (e.g., structural connectivity matrix 120) and functional connectivity data (e.g., functional connectivity matrix 130) in accordance with some embodiments. As shown in FIG. 1B, the structural connectivity matrix 120 and the functional connectivity matrix 130 are both provided as input to a graph theoretic analysis 150 and a gradient-based analysis 160, each of which is described in more detail herein. As shown, the output of graph theoretic analysis 150 and the output of gradient-based analysis 160 may be combined into a single multi-modal normative model 170. In some implementations, the output of graph theoretic analysis 150 may be a first multi-modal normative model and the output of gradient-based analysis 160 may be a second multi-modal normative model, and is not required in all embodiments that the outputs of graph theoretic analysis 150 and gradient-based analysis 160 be combined. Indeed, in some implementations only one of graph theoretic analysis 150 or gradient-based analysis 160 may be performed to generate a multi-modal normative model.

Figure 2:
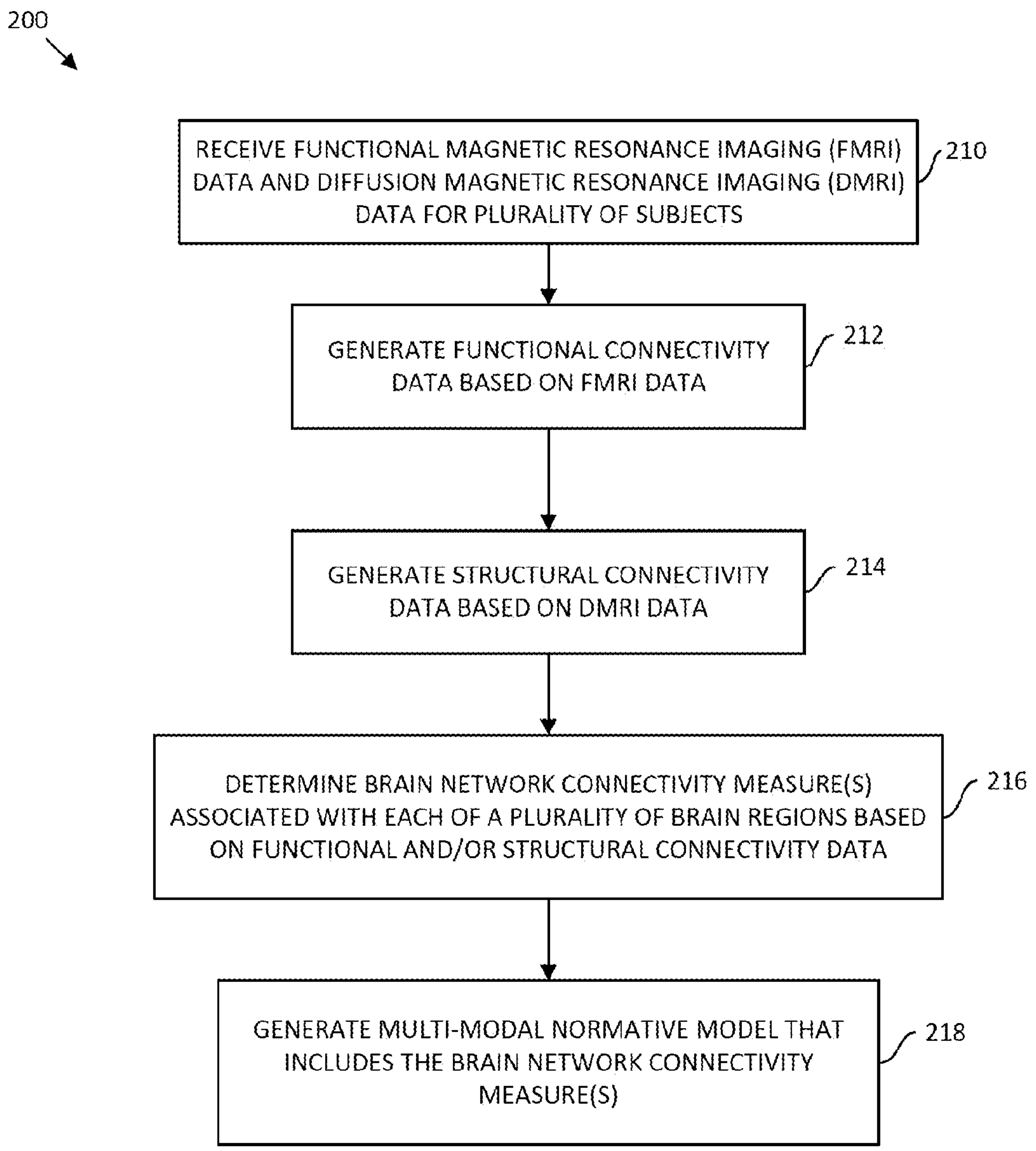
FIG. 2 is a flowchart of a process for generating a multi-modal normative model in accordance with some embodiments of the present disclosure.
Figure 3A:
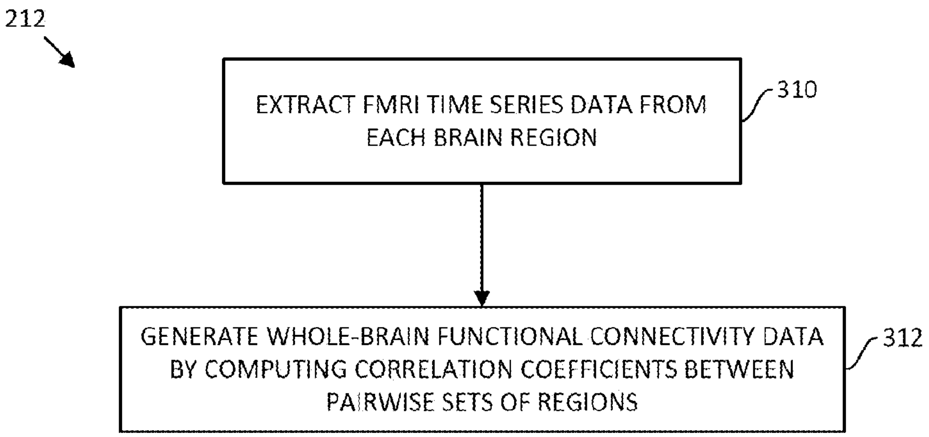
FIG. 3A is a flowchart of a process for generating functional connectivity data based on functional magnetic resonance imaging data in accordance with some embodiments of the present disclosure.

FIG. 2 is a flowchart of a process 200 for generating a multi-model normative model that includes at brain network connectivity measure in accordance with some embodiments of the present disclosure. In act 210, functional magnetic resonance imaging (fMRI) data (e.g., resting-state fMRI data) and diffusion magnetic resonance imaging (dMRI) data is received for a plurality of subjects. Process 200 then proceeds to act 212, where functional connectivity data (e.g., a functional connectivity matrix) is generated based on the fMRI data. As shown in FIG. 3A, act 212 may include act 310, where fMRI time series data may be extracted from each of a plurality brain regions. Subsequently, in act 312, functional connectivity data (e.g., a functional connectivity matrix) may be generated by computing correlation coefficients between pairwise sets of brain regions.

Figure 3B:
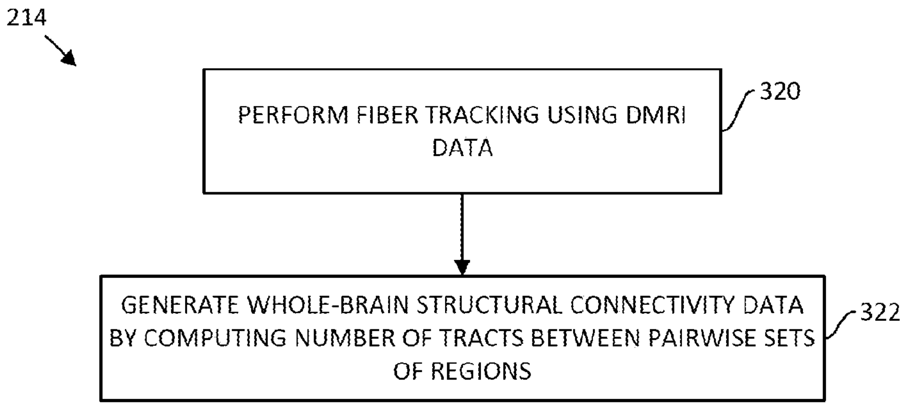
FIG. 3B is a flowchart of a process for generating structural connectivity data based on functional magnetic resonance imaging data in accordance with some embodiments of the present disclosure.

Returning to FIG. 2, process 200 proceeds to act 214, where structural connectivity data (e.g., a structural connectivity matrix) is generated based on the diffusion MRI data for each of a plurality of human subjects. As shown in FIG. 3B, act 214 may include act 320, where fiber tracking (e.g., tractography) may be performed using the dMRI data to identify white matter tracts connecting brain regions. Subsequently, in act 322, whole-brain structural connectivity data (e.g., a structural connectivity matrix) may be generated by computing a number of tracts connecting pairwise sets of brain regions. Although shown as being performed serially, it should be appreciated that acts 212 and 214 may be performed in any order, serially or in parallel, and embodiments of the present disclosure are not limited in this respect.

Returning to FIG. 2, process 200 proceeds to act 216 where one or more brain connectivity measures associated with each of a plurality of brain regions are determined based on the functional connectivity data and/or the structural connectivity data. For instance, as described in connection with FIG. 1B, a graph theoretic analysis 150 and/or a gradient-based analysis 160 may be performed using the functional connectivity data and/or the structural connectivity data to generate brain network connectivity measures for each of a plurality of brain regions. Process 200 then proceeds to act 218, where a multi-modal normative model that includes the brain network connectivity measure(s) determined in act 216 is generated.

Figure 4:
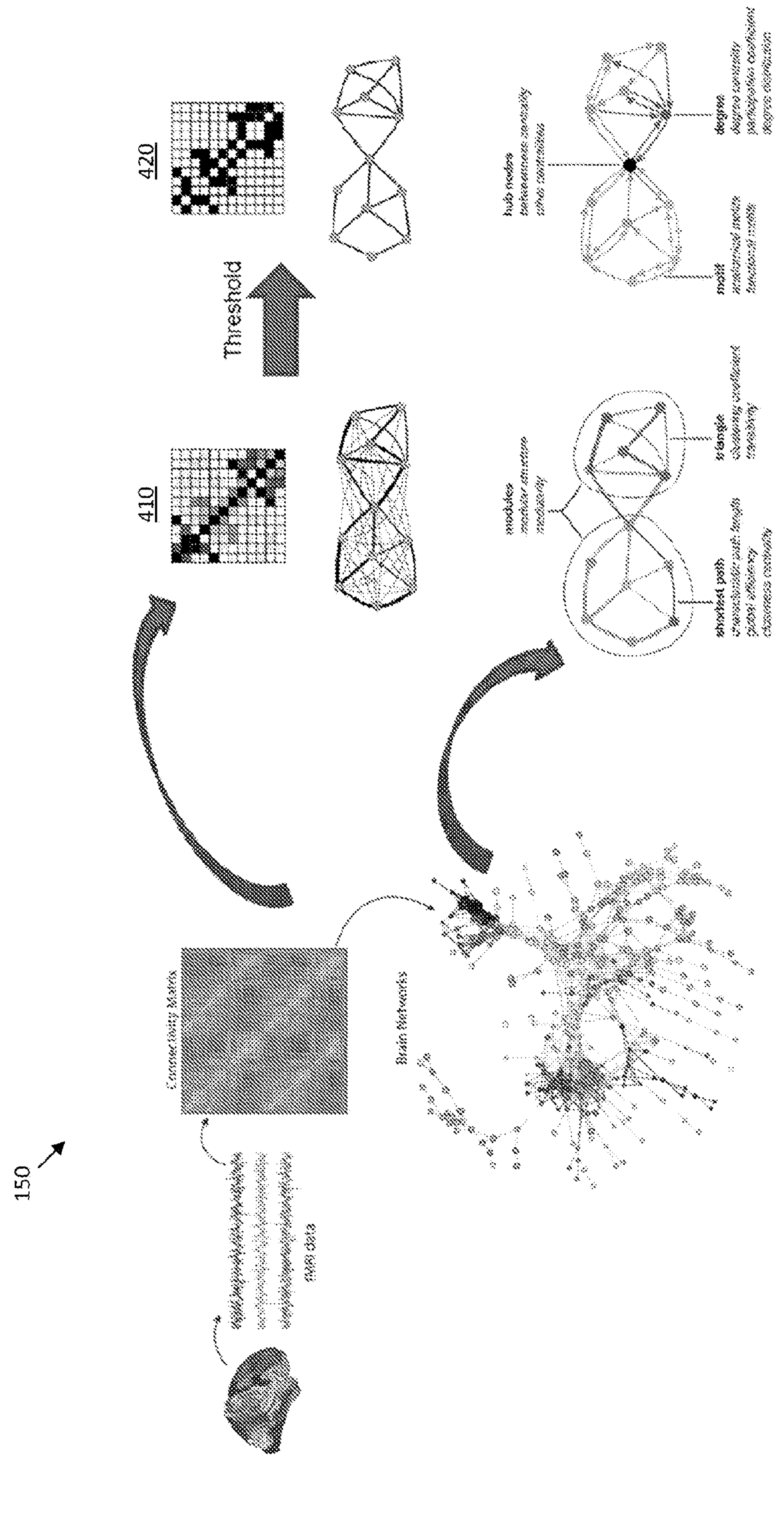
FIG. 4 schematically illustrates a process for using graph theoretic analysis to generate one or more graph theoretic measures based on a connectivity matrix in accordance with some embodiments of the present disclosure.

FIG. 4 schematically illustrates a process 400 for performing a graph theoretic analysis 150 in accordance with some embodiments of the present disclosure. As previously described, a functional connectivity matrix may be generated based on time series fMRI data extracted from each of a plurality of brain regions. The functional connectivity matrix represents functional connections between brain regions as measured, for example, by Pearson correlation coefficients between pairwise sets of brain regions. In the graph theoretic analysis 150 shown in FIG. 4, the goal is to calculate from the functional connectivity matrix, one or more graph theoretic measures (e.g., Degree, Betweeness Centrality, etc.) for each of the plurality of brain regions. In some implementations, the functional connectivity matrix may be Fisher Z-transformed, as schematically illustrated in FIG. 4 as act 410. The Z-transformed values may be thresholded in act 420 to retain a certain proportion of connections in the functional connectivity matrix. In some implementations, the Z-transformed and thresholded functional connectivity matrix values are binarized, for example, such that the retained connections are assigned a value of 1, and other connections below the threshold assigned a value of 0. The binarized functional connectivity matrix values are then provided as input to a graph theoretic process in which local topographical properties (graph theoretic measures) are determined. FIG. 4 illustrates exemplary graph theoretic measures that may be determined in accordance with some embodiments. In some implementations, one or more of the graph theoretic measure may be normalized. Although shown in FIG. 4 as being performed to analyze a functional connectivity matrix, the graph theoretic analysis shown in FIG. 4 may similarly be used to analyze a structure connectivity matrix to generate one or more structural-based graph theoretic measures.

Figure 5:
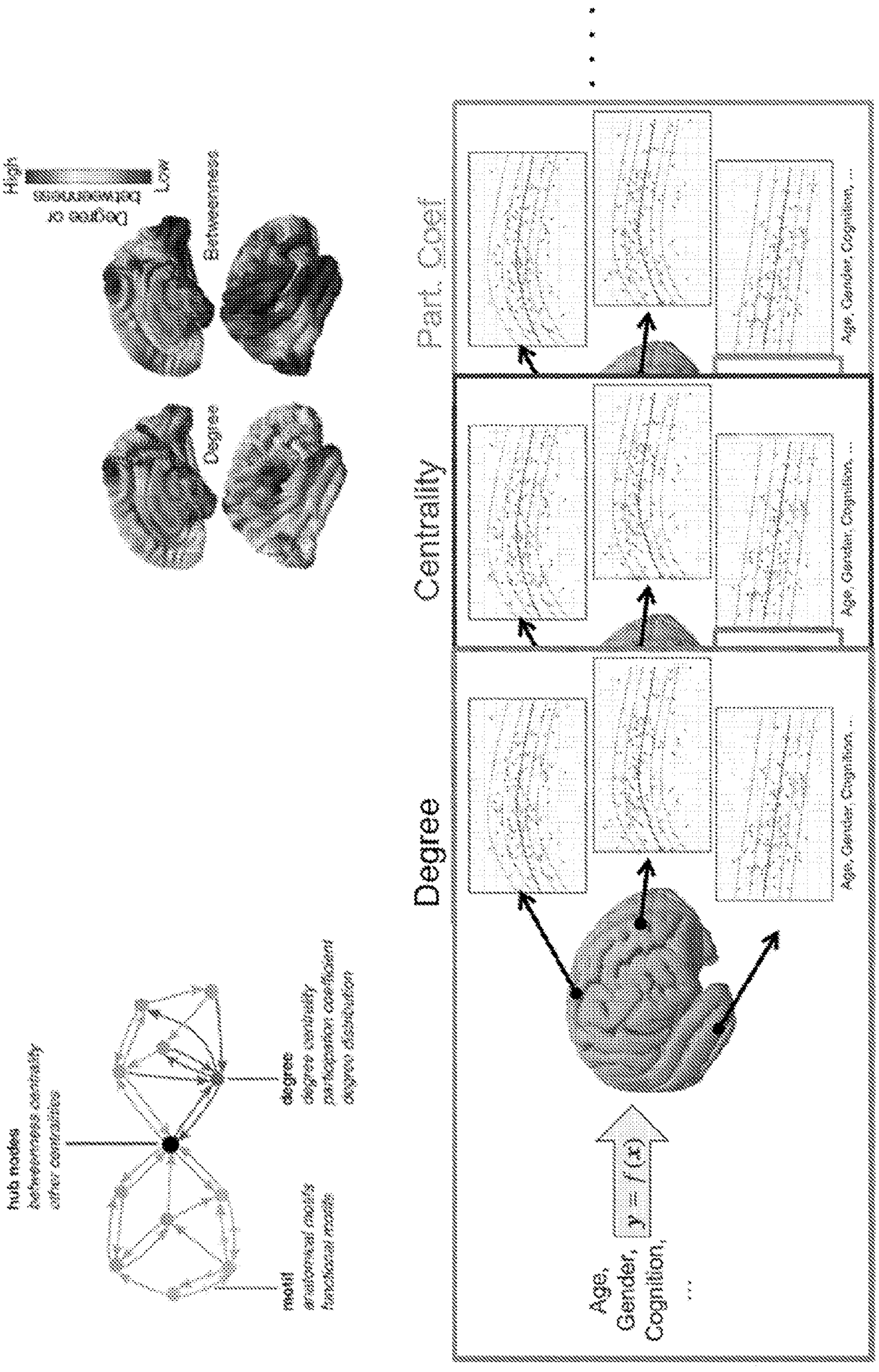
FIG. 5 schematically illustrates a process for generating a multi-modal normative model based on one or more graph theoretic measure generated in accordance with some embodiments of the present disclosure.

FIG. 5 schematically illustrate a process for generating a multi-modal normative model based on the graph theoretic measures(s) determined, for example, using the process illustrated in FIG. 4. FIG. 5 illustrates three example graph theoretic measures—Degree, Centrality, and Participation Coefficient that may be used to generate a normative model in accordance with the techniques described herein. In some implementations, each graph theoretic measure is z-normalized across the plurality of human subjects. Regression models predicting each graph theoretic measure for each brain region can then be built using one or more covariates, which may include subject demographic information (e.g., age, gender) or health status information. To mitigate overfitting and improve generalization of predictions, in some implementations the best predictive model may be determined using cross-validation. For each region, the prediction intervals, single case significance tests of graph theory score abnormality, and effect size may be computed.

Figure 6:
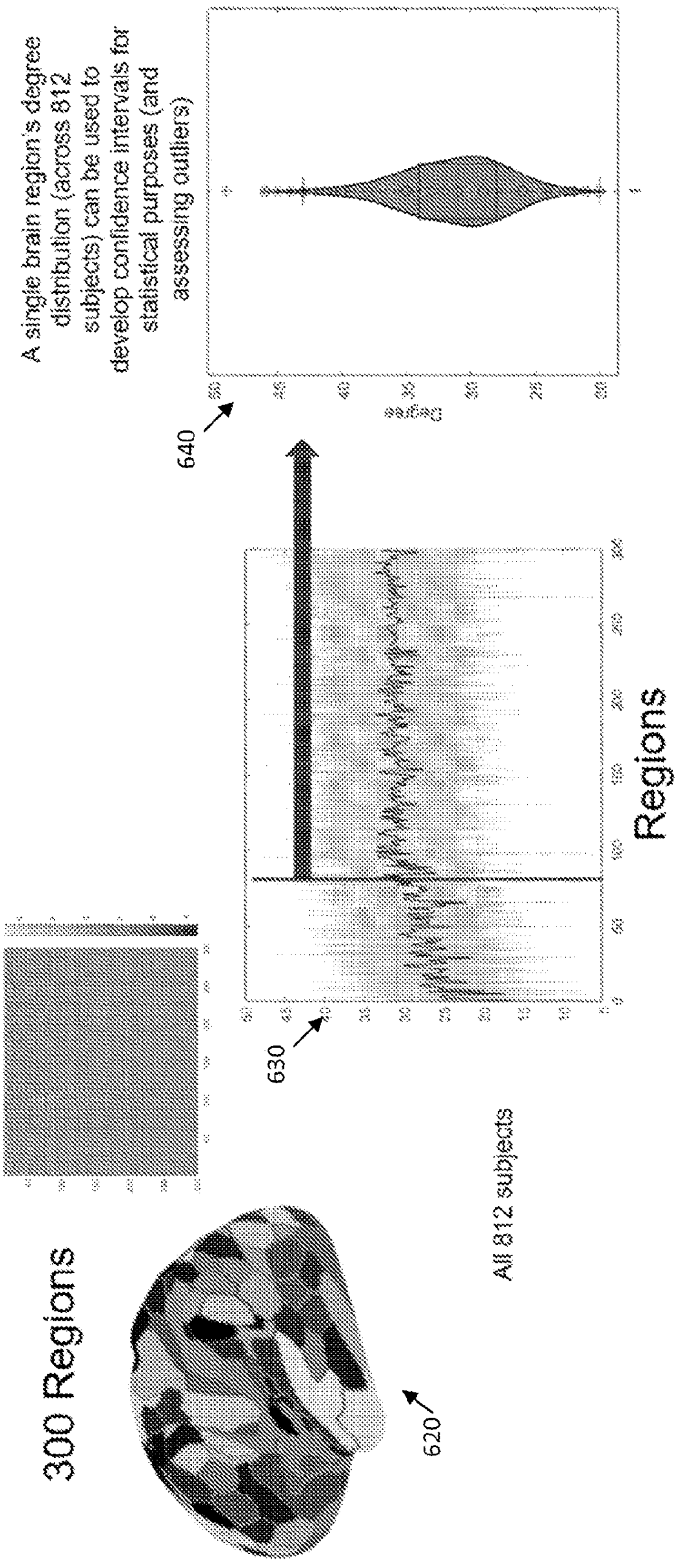
FIG. 6 schematically illustrates that a multi-modal normative model generated in accordance with some embodiments of the present disclosure may include a distribution of values for one or more graph theoretic measures for each of a plurality of brain regions.

FIG. 6 schematically illustrates how, for a single graph theoretic measure (e.g., Degree), within a single brain region, a distribution of values across a plurality of subjects can be used to develop confidence intervals for statistical purposes including assessing outliers. In the example of FIG. 6, a connectivity matrix 610 (e.g., structural or functional) was analyzed with graph theoretic analysis across a plurality of brain regions 620 to yield values for the graph theoretic measure Degree. The plot 630 illustrates the different brain regions on the x-axis and the distribution of Degree values across the plurality of human subjects on the y-axis. As shown schematically in illustration 640, for a single brain region (i.e., a single point along the x-axis in plot 630), the Degree values across the plurality of subjects (812 subjects in FIG. 6) yields a distribution for the Degree graph theoretic measure for that brain region. The distribution for each of one or more graph theoretic measures can be associated with the corresponding brain region included in the multi-modal normative model. In this way, within the multi-modal normative model, each of a plurality of brain regions may be associated with different distributions of values for each of a plurality of graph theoretic measures.

Figures 7A, 7B:
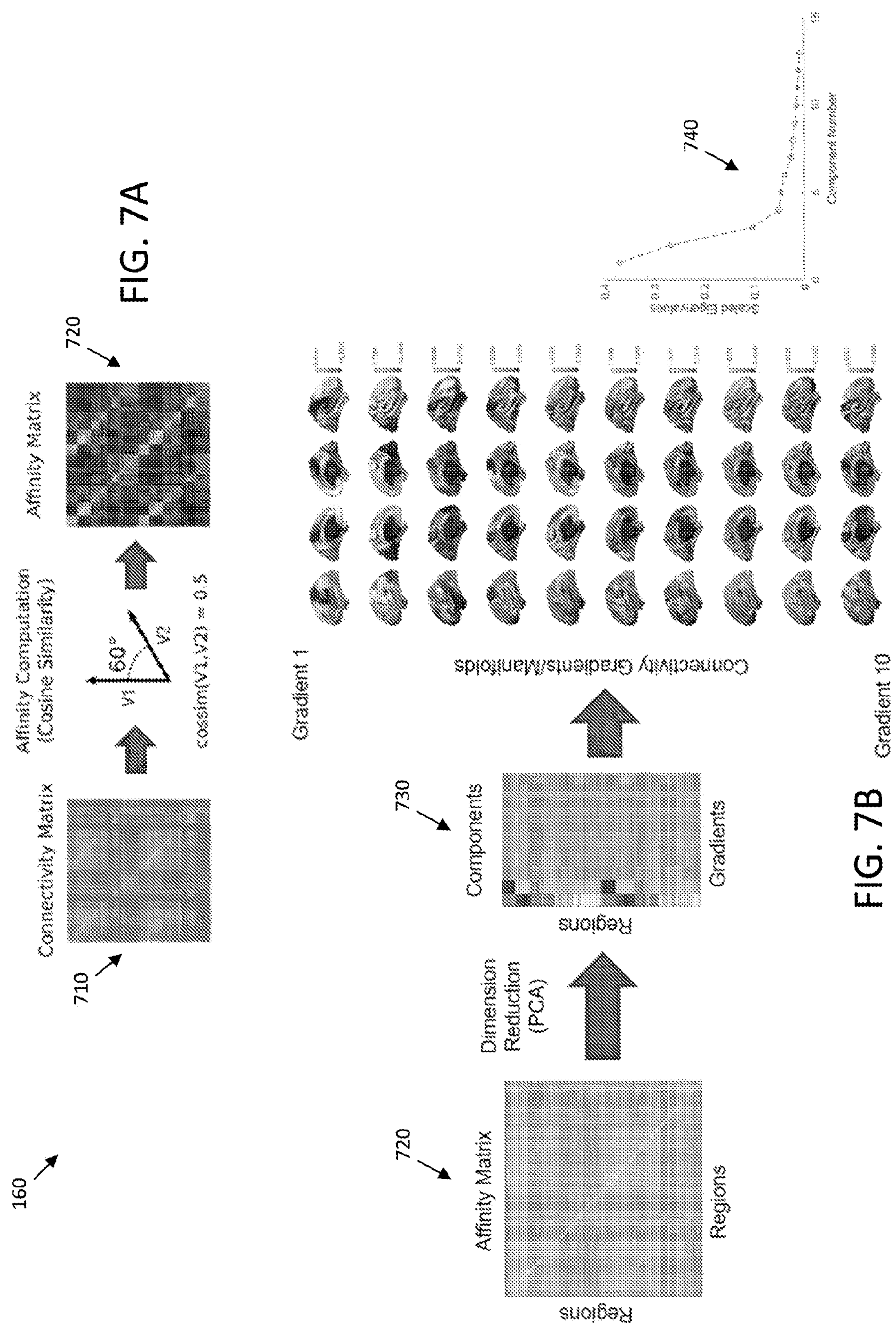
FIGS. 7A and 7B schematically illustrate a process for using gradient-based analysis to generate one or more gradient-based measures based on a connectivity matrix in accordance with some embodiments of the present disclosure.

FIGS. 7A and 7B schematically illustrate a process for performing gradient-based analysis 160 on a connectivity matrix (e.g., a structural or functional connectivity matrix) in accordance with some embodiments. As shown in FIG. 7A, an affinity matrix 720 may be determined by applying an affinity computation (e.g., cosine similarity) to a connectivity matrix 710. The affinity matrix captures the similarity between regions in their patterns of connections (i.e., each cell in the affinity matrix represents the similarity between two rows in the connectivity matrix). In some implementations, the connectivity matrix 710 is thresholded (e.g., row-wise proportion thresholded) prior to apply the affinity computation. As shown in FIG. 7B, the affinity matrix 720 may then be subjected to dimension reduction to generate a low dimensional manifold representation 730 of the affinity matrix 720. Any suitable linear or non-linear dimension reduction process may be used to generate representation 730. Non-limiting examples of dimension reduction processes include Principal Components Analysis (PCA), and Diffusion Map Embedding. As shown in FIG. 7B, the low dimensional manifold representation defines a plurality of "brain gradients" (e.g., 10 gradients) that characterize the main patterns of covariation in the affinity matrix. Any suitable number of gradients can be used in embodiments of the present disclosure. As shown in plot 740, which shows the gradient number on the x-axis and the scaled eigenvalues of representation 730 on the y-axis, most of the information related to covariation is represented in the first few (e.g., 3-5 gradients), with lesser information at the higher gradients.

Figure 8B:
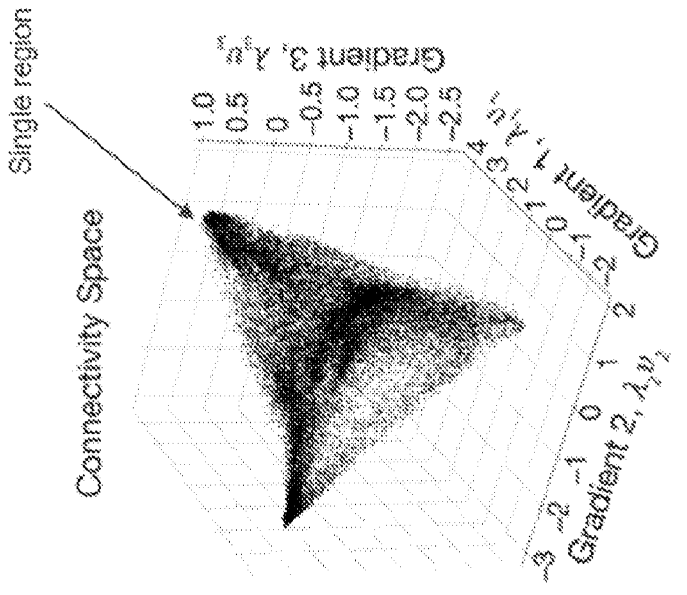
FIGS. 8A and 8B schematically illustrate gradients representing connectivity measures for different brain regions, which may be used to generate a multi-modal normative model in accordance with some embodiments of the present disclosure.
Figure 8A:
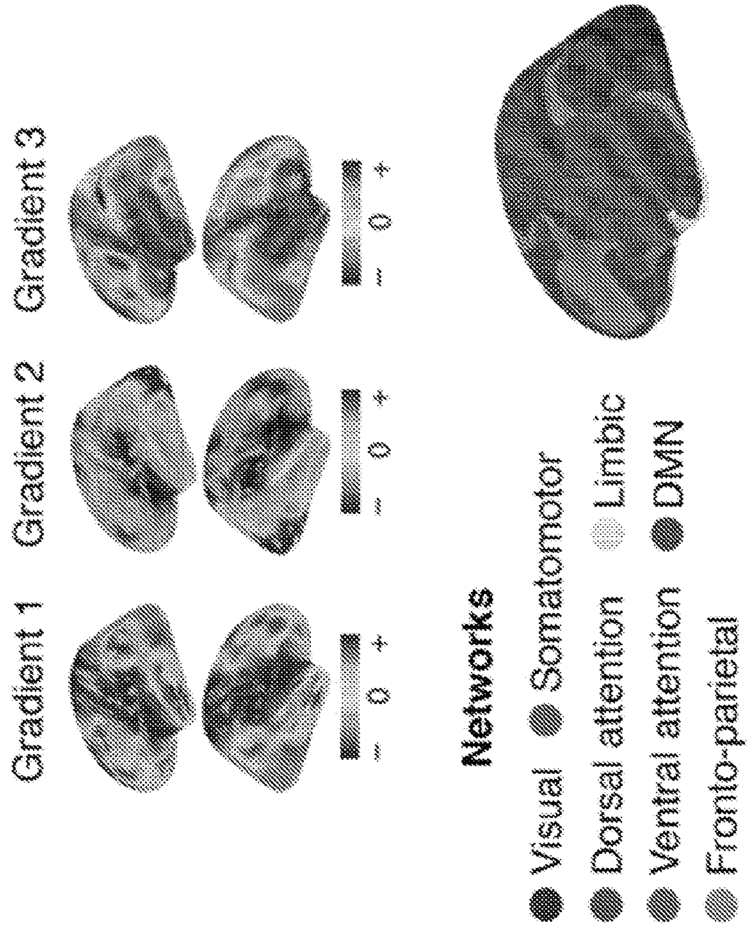

FIG. 8A schematically illustrates information for the first three gradients output from a gradients-based analysis performed in accordance with the techniques described herein. The gradients succinctly capture the macroscale organization of the cortex and allow the activity of brain regions to be understood in the context of whole-brain distributed networks. For instance, in the example shown in FIG. 8A, Gradient 1 may represent a comparison between the default mode network (DMN) and the rest of the brain, Gradient 2 may represent a comparison between the visual network and the ventral attention network, and Gradient 3 may represent a comparison between the dorsal attention network/fronto-parietal cortex and the somatosensory and auditory cortices. FIG. 8B is a three-dimensional plot showing the low-dimensional manifold, with each of the gradient values plotted on one of the x-, y- and z-axes, and where each data point within the manifold space represents a single brain region, with its location in the manifold space indicating its loading onto each of the gradients.

Figure 9B:
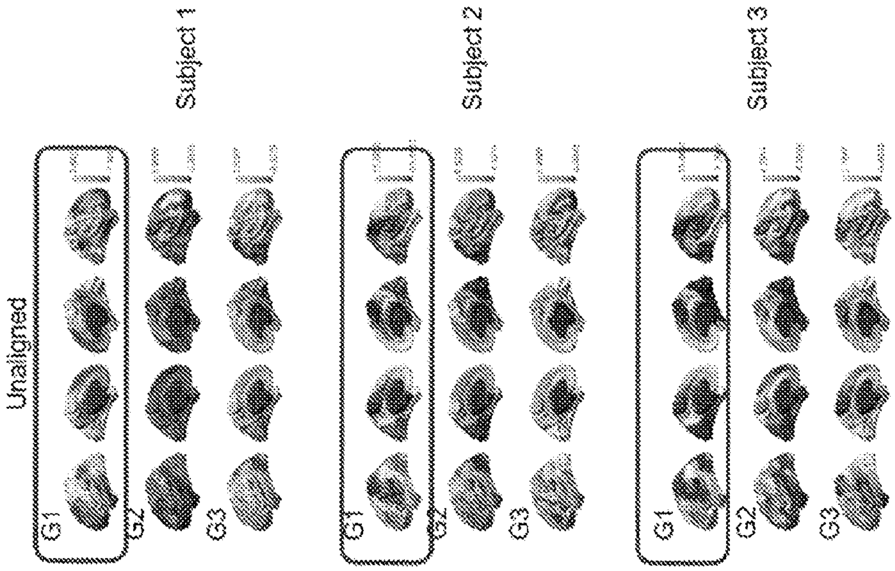
FIGS. 9A and 9B illustrates example inter-subject differences introduced, at least in part, by dimensionality reduction as part of a gradient-based analysis in accordance with some embodiments of the present disclosure.
Figure 9A:
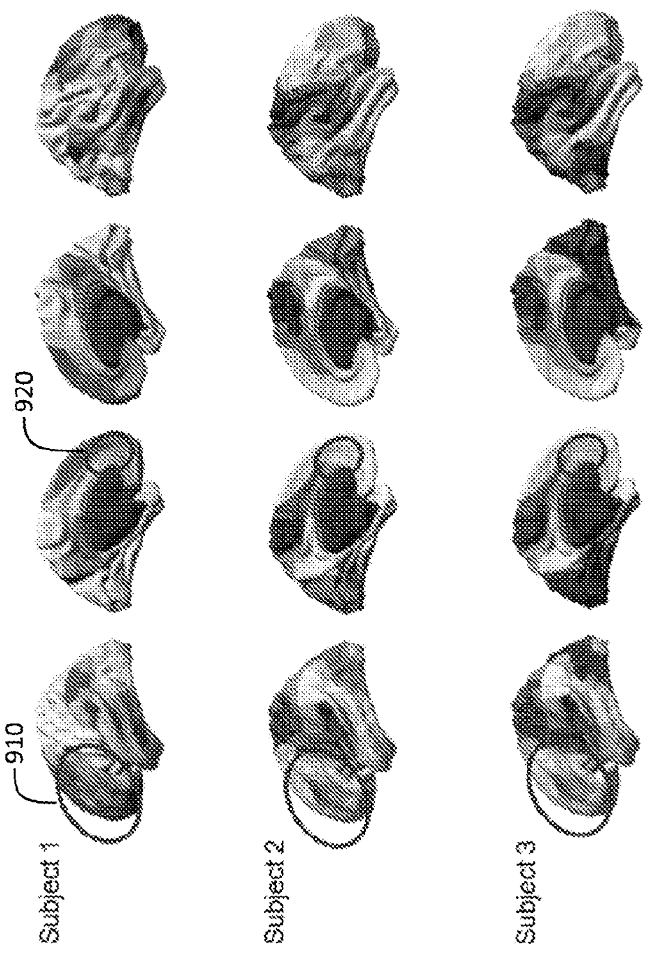

The inventors have recognized that large inter-subject differences are apparent when dimension reduction (e.g., PCA) is applied to the affinity matrix for each subject. An example of these inter-subject differences is shown in FIGS. 9A and 9B, in which cross-subject comparisons for two different brain regions are shown. As can be observed, although subjects 2 and 3 show somewhat similar Gradient 1 values within region 910, subject 1 shows very different Gradient 1 values in region 910. Furthermore, the Gradient 1 values for all three subjects are quite different in region 920. Similar inter-subject differences are also observed for Gradient 2 and Gradient 3 as shown in FIG. 9B.

Figure 10:
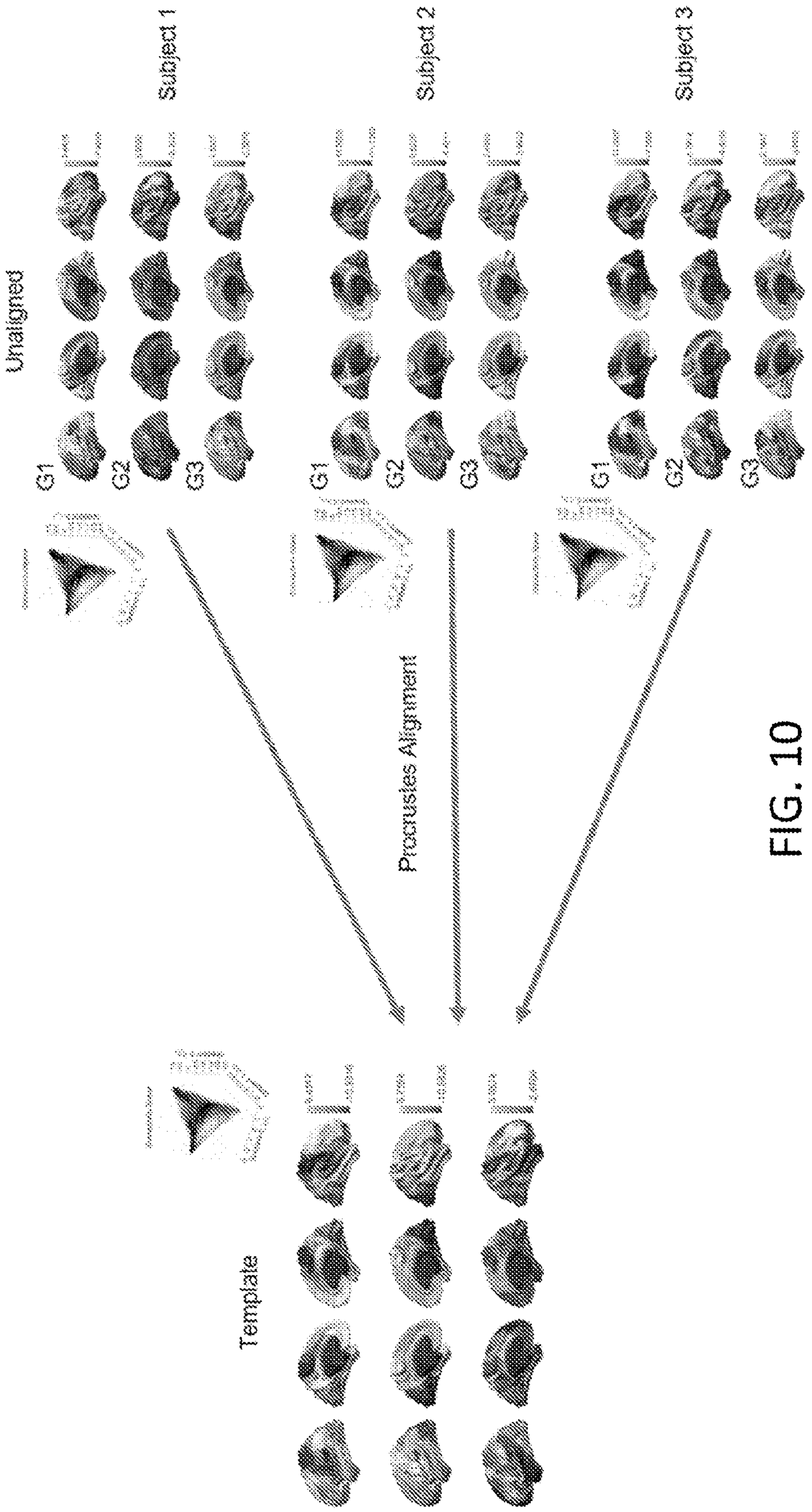
FIG. 10 schematically illustrates a process for aligning gradients determined for individual subjects to a template representation in accordance with some embodiments of the present disclosure.
Figure 11:
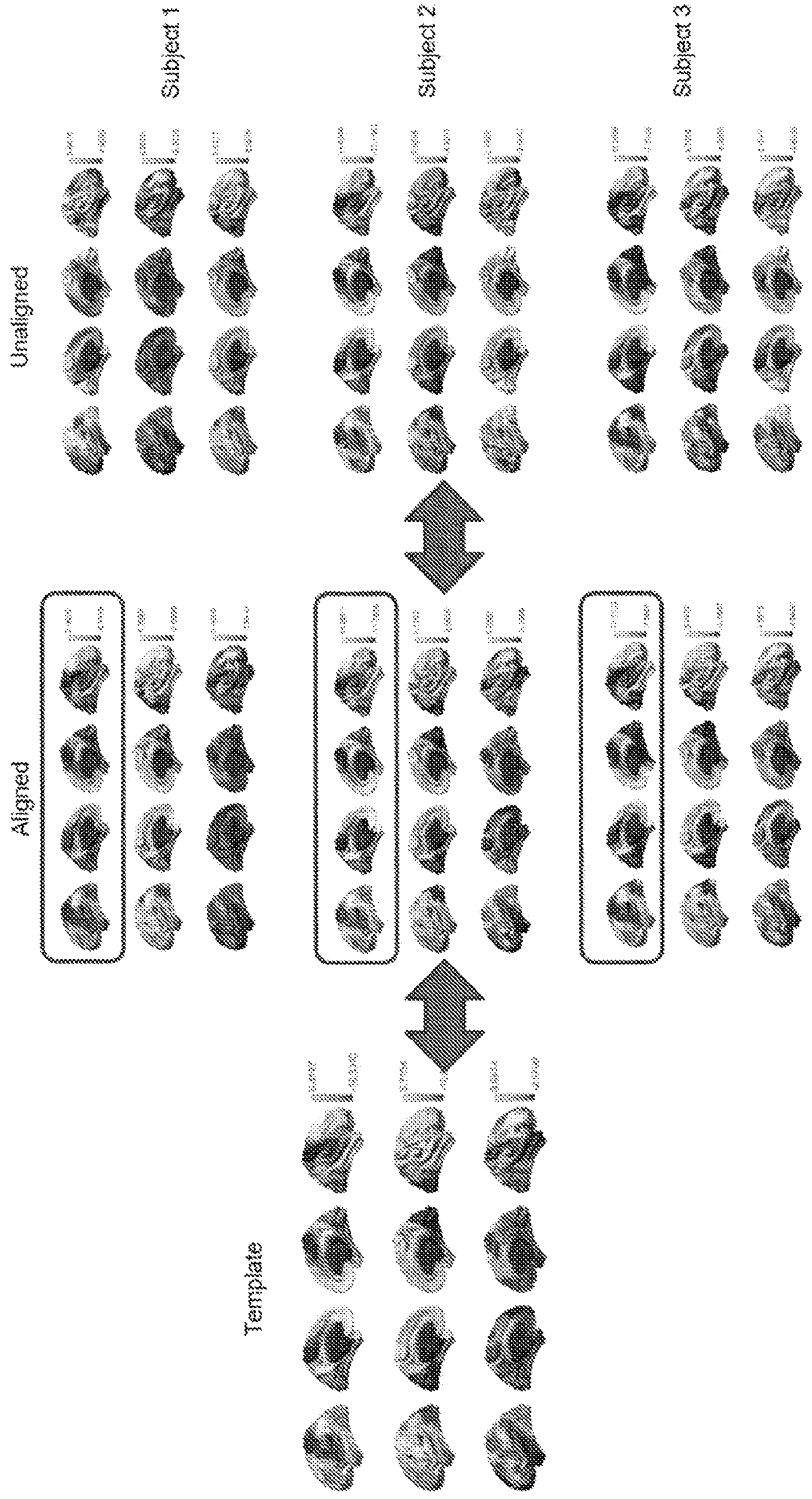
FIG. 11 illustrates a comparison between the unaligned gradients shown in FIG. 9B and aligned gradients using the alignment process shown in FIG. 10 in accordance with some embodiments of the present disclosure.

To at least partially mitigate inter-subject differences introduced from applying dimension reduction techniques, some embodiments align the gradient values for each subject to a template as shown in FIG. 10. In some implementations, the template used for alignment of the gradients may be generated based on data from all subjects (e.g., based on the average connectivity matrix across all subjects). In other implementations, the template used for alignment may be based, at least in part, on a connectivity matrix determined for a separate cohort of subjects. In the example shown in FIG. 10, a Procrustes transformation is used to align each individual subject's gradients to the template. FIG. 11 schematically illustrates a comparison between the unaligned gradient values shown in FIG. 9B and corresponding aligned gradient values for the same subjects following Procrustes alignment to a template as performed in accordance with the techniques described herein. As can be appreciated, the alignment procedure reduced the inter-subject differences for Gradient 1 in the regions highlighted in FIG. 9A.

Following alignment, each individual subject's gradients can be compared at each of a plurality of brain regions to generate a distribution of gradient values that may be associated with the brain region. A multi-modal normative model may then be generated based on the distributions of gradients for each of the brain regions. For instance, regression models predicting each brain region's projection onto each brain gradient may be built using one or more covariates, which may include subject demographic information (e.g., age, gender) or health status information. To mitigate overfitting and improve generalization of predictions, in some implementations the best predictive model may be determined using cross-validation. For each region, the prediction intervals, single case significance tests of gradient loading abnormality, and effect size may be computed.

Following its generation, a multi-modal normative model created in accordance with the techniques described herein may be used to identify abnormalities within patients that were not used to generate the model. For instance, the multi-modal normative model may be used to assess where, in the brain, a particular patient (e.g., a patient who recently had a stroke) shows deviations from the range of a normative population captured by the normative model. In such an instance, neuroimaging data (e.g., resting state fMRI data and/or diffusion MRI data) may be recorded from the patient and analyzed using the techniques described herein to determine brain network connectivity measures for each of a plurality of brain regions. The determined brain network connectivity measures may then be compared to the distributions of brain network connectivity measures represented in the multi-modal normative model to identify brain regions for which the patient has values outside of the normative population (e.g., a certain deviation (outside 95% confidence interval) from the mean of the distribution in the normative model), which may reveal brain regions having abnormal connectivity for the patient. By better understanding those brain regions that deviate from the normative population, it may be possible to provide improved (e.g., targeted) treatment for the patient.

Figure 12:
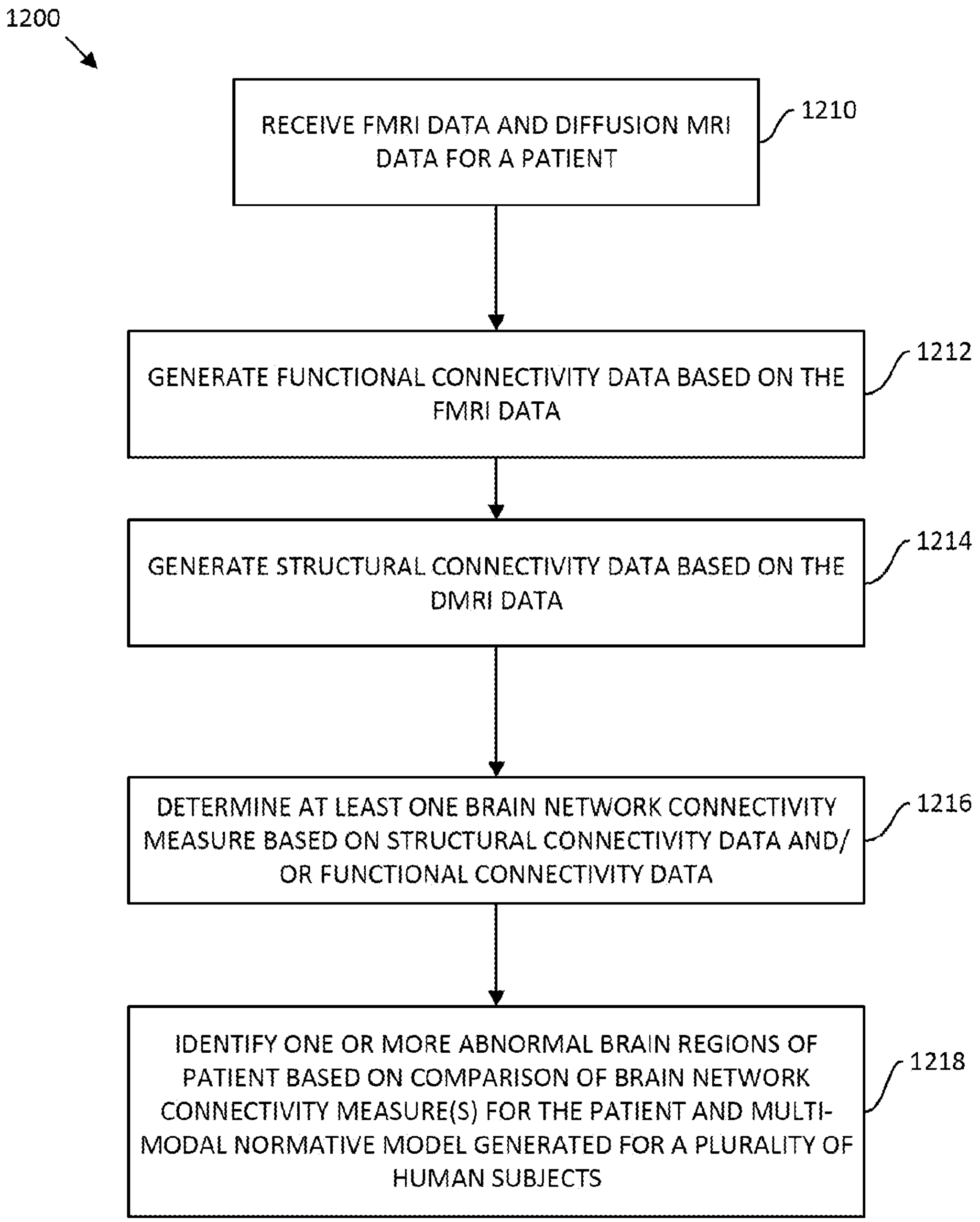
FIG. 12 is a flowchart of a process for using a multi-modal normative model generated in accordance with one or more of the techniques described herein to identify one or more brain regions showing abnormal network connectivity in accordance with some embodiments of the present disclosure.

FIG. 12 illustrates a process 1200 for using a multi-modal normative model created in accordance with the techniques described herein to identify one or more abnormal brain regions (e.g., brain regions showing deviations from the mean of the distribution) for one or more brain network connectivity measures, in accordance with some embodiments. In act 1210, fMRI data and diffusion MRI data associated with a patient may be received. Process 1200 then proceeds to act 1212, where functional connectivity data (e.g., a functional connectivity matrix) for the patient is generated based on the received fMRI data using one or more of the techniques described herein. Process 1200 then proceeds to act 1214, where structural connectivity data (e.g., a structural connectivity matrix) for the patient is generated based on the received diffusion MRI data using one or more of the techniques described herein. Process 1200 then proceeds to act 1216, where at least one brain network connectivity measure (e.g., one or more gradient-based connectivity measure and/or one or more graph theoretic measure) is determined for the patient based on the structural connectivity data and/or the function connectivity data using one or more of the techniques described herein. Process 1200 then proceeds to act 1218, where the brain network connectivity measure(s) determined for the patient are compared to the corresponding distributions of brain network connectivity measure values represented in the multi-modal normative model to identify one or more "abnormal" brain regions for the patient that deviate from the normative population. As discussed herein, the identification of abnormal brain region(s) in the patient may facilitate treatment of the patient using therapy targeted to the abnormal region(s).

Figure 13:
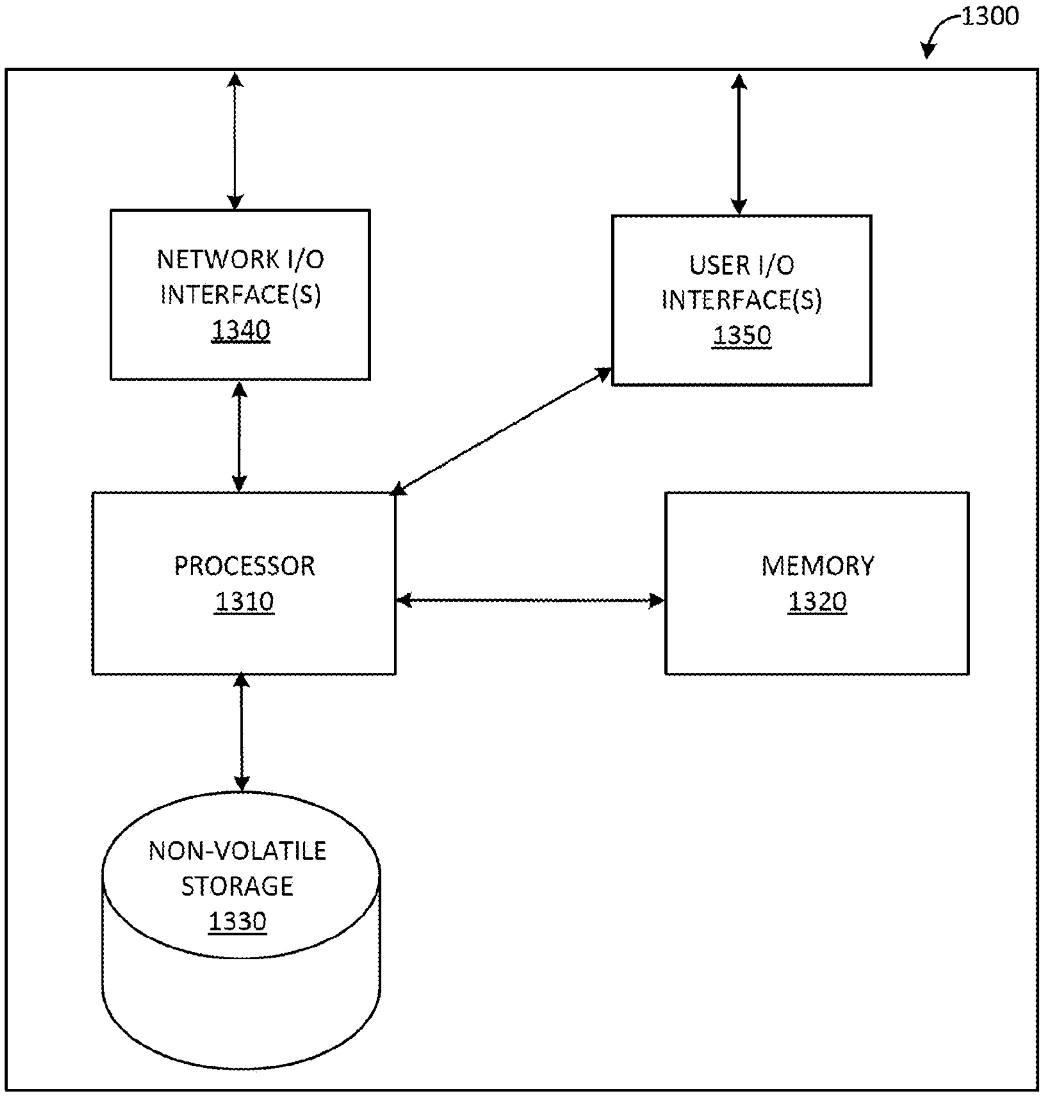
FIG. 13 is an example of a computer system on which some embodiments of the present disclosure may be implemented.

An illustrative implementation of a computer device/system 1300 that may be used in connection with any of the embodiments of the technology described herein is shown in FIG. 13. The computer system 1300 includes one or more processors 1310 and one or more articles of manufacture that comprise non-transitory computer-readable storage media (e.g., memory 1320 and one or more non-volatile storage media 1330). The processor 1310 may control writing data to and reading data from the memory 1320 and the non-volatile storage device 1330 in any suitable manner, as the aspects of the technology described herein are not limited in this respect. To perform any of the functionality described herein, the processor 1310 may execute one or more processor-executable instructions stored in one or more non-transitory computer-readable storage media (e.g., the memory 1320), which may serve as non-transitory computer-readable storage media storing processor-executable instructions for execution by the processor 1310.

Computing device 1300 may also include a network input/output (I/O) interface 1340 via which the computing device may communicate with other computing devices (e.g., over a network), and may also include one or more user I/O interfaces 1350, via which the computing device may provide output to and receive input from a user. The user I/O interfaces may include devices such as a keyboard, a mouse, a microphone, a display device (e.g., a monitor or touch screen), speakers, a camera, and/or various other types of I/O devices.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware or with one or more processors programmed using microcode or software to perform the functions recited above.

In this respect, it should be appreciated that one implementation of the embodiments of the present invention comprises at least one non-transitory computer-readable storage medium (e.g., a computer memory, a portable memory, a compact disk, etc.) encoded with a computer program (i.e., a plurality of instructions), which, when executed on a processor, performs the above-discussed functions of the embodiments of the present invention. The computer-readable storage medium can be transportable such that the program stored thereon can be loaded onto any computer resource to implement the aspects of the present invention discussed herein. In addition, it should be appreciated that the reference to a computer program which, when executed, performs the above-discussed functions, is not limited to an application program running on a host computer. Rather, the term computer program is used herein in a generic sense to reference any type of computer code (e.g., software or microcode) that can be employed to program a processor to implement the above-discussed aspects of the present invention.

Various aspects of the present invention may be used alone, in combination, or in a variety of arrangements not specifically discussed in the embodiments described in the foregoing and are therefore not limited in their application to the details and arrangement of components set forth in the foregoing description or illustrated in the drawings. For example, aspects described in one embodiment may be combined in any manner with aspects described in other embodiments.

Also, embodiments of the invention may be implemented as one or more methods, of which an example has been provided. The acts performed as part of the method(s) may be ordered in any suitable way. Accordingly, embodiments may be constructed in which acts are performed in an order different than illustrated, which may include performing some acts simultaneously, even though shown as sequential acts in illustrative embodiments.

The phraseology and terminology used herein is for the purpose of description and should not be regarded as limiting. The use of "including," "comprising," "having," "containing," "involving," and variations thereof, is meant to encompass the items listed thereafter and additional items.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting.

The invention claimed is:

1. A method of generating a multi-modal normative model of a brain, the method comprising:

receiving functional magnetic resonance imaging (fMRI) data and diffusion MRI (dMRI) data for each of a plurality of human subjects;

generating, based on the fMRI data, functional connectivity data for each of the plurality of human subjects;

generating, based on the dMRI data, structural connectivity data for each of the plurality of human subjects;

determining, for each of the plurality of human subjects, based on the structural connectivity data and/or the functional connectivity data, at least one brain network connectivity measure associated with each of a plurality of brain regions; and generating a multi-modal normative model that is based on, for each brain region of the plurality of brain regions, at least one distribution of values among the plurality of human subjects, each such distribution corresponding to a respective brain network connectivity measure associated with the brain region.

2. The method of claim 1, wherein generating functional connectivity data comprises:

extracting, within each of the plurality of brain regions, fMRI time series data; and computing, based on the extracted fMRI time series data, correlation coefficients between pairwise sets of regions of the plurality of brain regions, wherein the functional connectivity data includes the correlation coefficients for each region of the plurality of brain regions.

3. The method of claim 2, wherein the correlation coefficients are Pearson correlation coefficients.

4. The method of claim 1, wherein generating structural connectivity data comprises:

determining, based on the dMRI data, a number of fiber tracts connecting pairwise sets of regions of the plurality of brain regions, wherein the structural connectivity data includes the number of fiber tracts for each region of the plurality of brain regions.

5. The method of claim 1, wherein determining at least one brain network connectivity measure comprises:

performing graph theoretic analysis on the structural connectivity data and/or the functional connectivity data to define a plurality of brain network connectivity measures associated with each of the plurality of brain regions.

6. The method of claim 5, further comprising:

thresholding the functional connectivity data to generate thresholded functional connectivity data; and binarizing the thresholded functional connectivity data to generate binarized functional connectivity data, wherein performing graph theoretic analysis on the functional connectivity data comprises performing graph theoretic analysis on the binarized functional connectivity data.

7. The method of claim 5, further comprising:

thresholding the structural connectivity data to generate thresholded structural connectivity data; and binarizing the thresholded structural connectivity data to generate binarized structural connectivity data, wherein performing graph theoretic analysis on the structural connectivity data comprises performing graph theoretic analysis on the binarized structural connectivity data.

8. The method of claim 5, wherein performing graph theoretic analysis comprises:

computing at least one local topographical property of the structural connectivity data and/or the functional connectivity data.

9. The method of any of claim 5, wherein the plurality of brain network connectivity measures include one or more of degree, centrality and clustering coefficient.

10. The method of claim 5, wherein generating a multi-modal normative model comprises:

normalizing the at least one brain network connectivity measure across the plurality of human subjects; and generating the multi-modal normative model based on the normalized at least one brain connectivity measure.

11. The method of claim 1, wherein determining at least one brain network connectivity measure comprises:

constructing, based on the structural connectivity data and/or the functional connectivity data, an affinity matrix for each subject of the plurality of human subjects;

generating a set of gradients for each subject based, at least in part, on the affinity matrix;

aligning the set of gradients for each subject to a group averaged template; and determining, for each subject and for each of the plurality of brain regions, a projection of each brain region onto each gradient, thereby determining the at least one brain network connectivity measure for each region of the plurality of brain regions.

12. The method of claim 11, further comprising:

thresholding the functional connectivity data to generate thresholded functional connectivity data, wherein the constructing an affinity matrix based on the functional connectivity data comprises constructing the affinity matrix based on the thresholded functional connectivity data.

13. The method of claim 11, further comprising:

thresholding the structural connectivity data to generate thresholded structural connectivity data, wherein the constructing an affinity matrix based on the structural connectivity data comprises constructing the affinity matrix based on the thresholded structural connectivity data.

14. The method of claim 11, wherein constructing the affinity matrix comprises using cosine similarity to construct the affinity matrix.

15. The method of claim 11, wherein generating a set of gradients for each subject based, at least in part, on the affinity matrix comprises:

reducing a dimensionality of the affinity matrix to derive a low dimensional manifold representation of the affinity matrix, wherein the set of gradients is generated based on the low dimensional manifold representation.

16. The method of claim 11, wherein the at least one brain network connectivity measure includes a value representing a component loading onto each gradient in the set of gradients.

17. A computing device, comprising:

at least one computer processor; and at least one non-transitory computer-readable medium encoded with a plurality of instructions that, when executed by the at least one computer processor perform a method, the method comprising:

receiving functional magnetic resonance imaging (fMRI) data and diffusion MRI (dMRI) data for each of a plurality of human subjects;

generating, based on the fMRI data, functional connectivity data for each of the plurality of human subjects;

generating, based on the dMRI data, structural connectivity data for each of the plurality of human subjects;

determining, for each of the plurality of human subjects, based on the structural connectivity data and/or the functional connectivity data, at least one brain network connectivity measure associated with each of a plurality of brain regions; and generating a multi-modal normative model that is based on, for each brain region of the plurality of brain regions, at least one distribution of values among the plurality of human subjects, each such distribution corresponding to a respective brain network connectivity measure associated with the brain region.

18. A method of using a multi-modal normative model to identify one or more abnormal brain regions in a patient, the method comprising:

receiving functional magnetic resonance imaging (fMRI) data and diffusion MRI (dMRI) data for the patient;

generating, based on the fMRI data, functional connectivity data for the patient;

generating, based on the dMRI data, structural connectivity data for the patient;

determining, based on the structural connectivity data and/or the functional connectivity data, at least one brain network connectivity measure associated with each of a plurality of brain regions; and identifying one or more abnormal brain regions of the patient based, at least in part on a comparison of the determined at least one brain network connectivity measure for the patient and a multi-modal normative model, the multi-modal normative model being based on, for each brain region of the plurality of brain regions, at least one distribution of values among a plurality of human subjects, each such distribution corresponding to a respective brain network connectivity measure associated with the brain region, each brain network connectivity measure being determined, at least in part, based on structural connectivity data and/or functional connectivity data.

19. The method of claim 18, wherein generating functional connectivity data comprises:

extracting, within each of the plurality of brain regions, fMRI time series data; and computing, based on the extracted fMRI time series data, correlation coefficients between pairwise sets of regions of the plurality of brain regions, wherein the functional connectivity data includes the correlation coefficients for each region of the plurality of brain regions.

20. The method of claim 18, wherein determining at least one brain network connectivity measure comprises:

constructing, based on the structural connectivity data and/or the functional connectivity data, an affinity matrix for each subject of the plurality of human subjects;

generating a set of gradients for each subject based, at least in part, on the affinity matrix;

aligning the set of gradients for each subject to a group averaged template; and determining, for each subject and for each of the plurality of brain regions, a projection of each brain region onto each gradient, thereby determining the at least one brain network connectivity measure for each region of the plurality of brain regions.

* * * * *